United States Patent [19]

Jones

[11] Patent Number: 4,626,805
[45] Date of Patent: Dec. 2, 1986

[54] SURFACE MOUNTABLE MICROWAVE IC PACKAGE

[75] Inventor: Keith E. Jones, Aloha, Oreg.

[73] Assignee: Tektronix, Inc., Beaverton, Oreg.

[21] Appl. No.: 727,946

[22] Filed: Apr. 26, 1985

[51] Int. Cl.$^4$ .............................................. H01P 5/00
[52] U.S. Cl. ..................................... 333/33; 333/246; 333/260
[58] Field of Search .................... 333/33, 238, 246; 339/17 M, 17 LM; 361/414

[56] References Cited

U.S. PATENT DOCUMENTS 3,842,360 10/1974 Dickens ........................ 333/238 X
3,848,198 11/1974 DeBrecht et al. ............. 333/238 X
4,110,712 8/1978 Morris .......................... 333/238 X
4,543,544 9/1985 Ziegner ......................... 333/238 X Primary Examiner—Paul Gensler
Attorney, Agent, or Firm—Francis I. Gray

[57] ABSTRACT

A surface mountable microwave IC package uses printed transmission lines on a printed circuit board in lieu of plumbing between milled packages. A backside co-planar waveguide is connected to a topside microstrip line by a through-hole in a carrier substrate. To compensate for inductance added by the hole and transmission line ends, a gap is adjusted to provide compensation capacitance. Hermetic sealing of the package is assured by brazing a lead frame over the through-hole and using a solder sealed lid. The lid provides both a hermetic seal and shielding.

9 Claims, 7 Drawing Figures

SURFACE MOUNTABLE MICROWAVE IC PACKAGE

BACKGROUND OF THE INVENTION

1. Field of the Invention

The present invention relates to integrated circuit (IC) packages, and more particularly to a surface mountable microwave IC package which provides high performance at a reasonable cost.

2. Description of the Prior Art

The application of microwave gallium-arsenide (GaAs) integrated circuits is limited by package performance and/or complexity. Typical packages using milled metal enclosures with ceramic substrates are expensive and rarely hermetic. Hermetic enclosures, such as Kyocera or NTK multilayer ceramic carriers, are limited to one to two gigahertz with reasonable performance. High performance carriers, such as the Hypcon described in U.S. Pat. No. 4,255,003 issued Mar. 10, 1981 entitled "Electrical Connector" by William E. Berg, are expensive and complex.

What is desired is a low cost, hermetic or semi-hermetic, high performance, surface mountable GaAs microwave IC carrier.

SUMMARY OF THE INVENTION

Accordingly, the present invention provides a surface mountable microwave IC package which uses printed transmission lines on a printed circuit board in lieu of plumbing between milled packages. A back side co-planar waveguide line is connected to a topside microstrip line by a through-hole in a carrier substrate. To compensate for inductance added by the hole and transmission line ends, a gap is adjusted to provide compensation capacitance. Hermetic sealing of the package is assured by brazing a lead frame over the through-hole and using a solder sealed lid. The lid provides both a hermetic seal and shielding.

The objects, advantages and novel features of the present invention will be apparent from the following detailed description when read in conjunction with the appended claims and attached drawing.

DESCRIPTION OF THE PREFERRED EMBODIMENT

Figure 1:
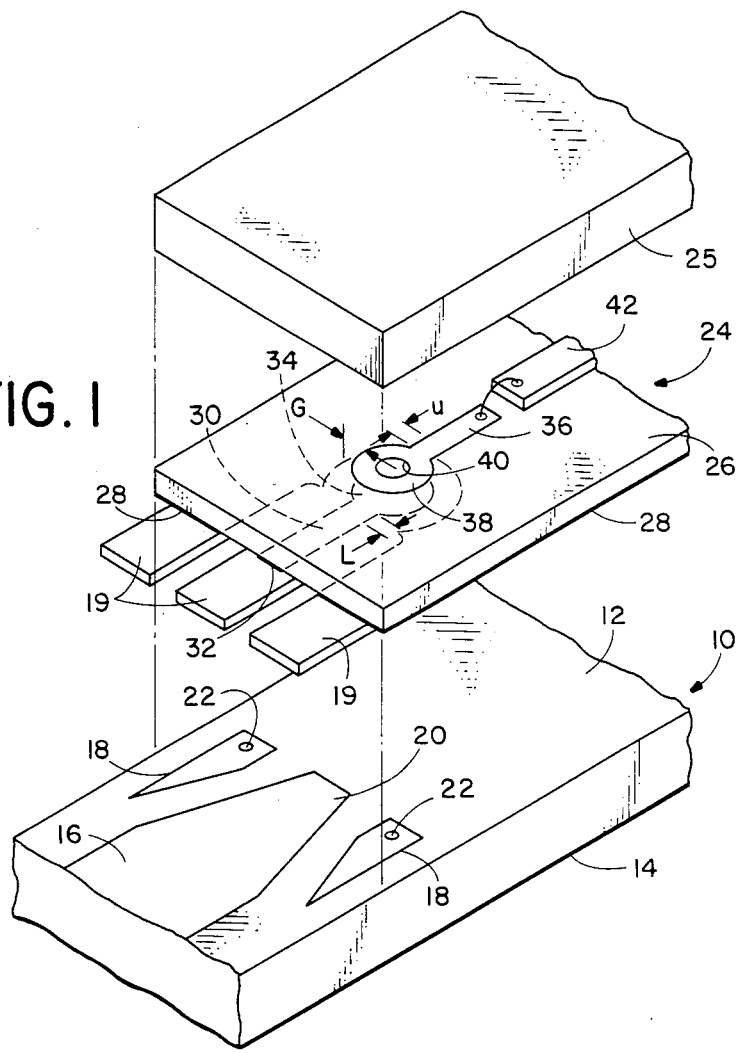
FIG. 1 is an exploded perspective view of an IC surface mountable microwave package according to the present invention.
Figure 3:
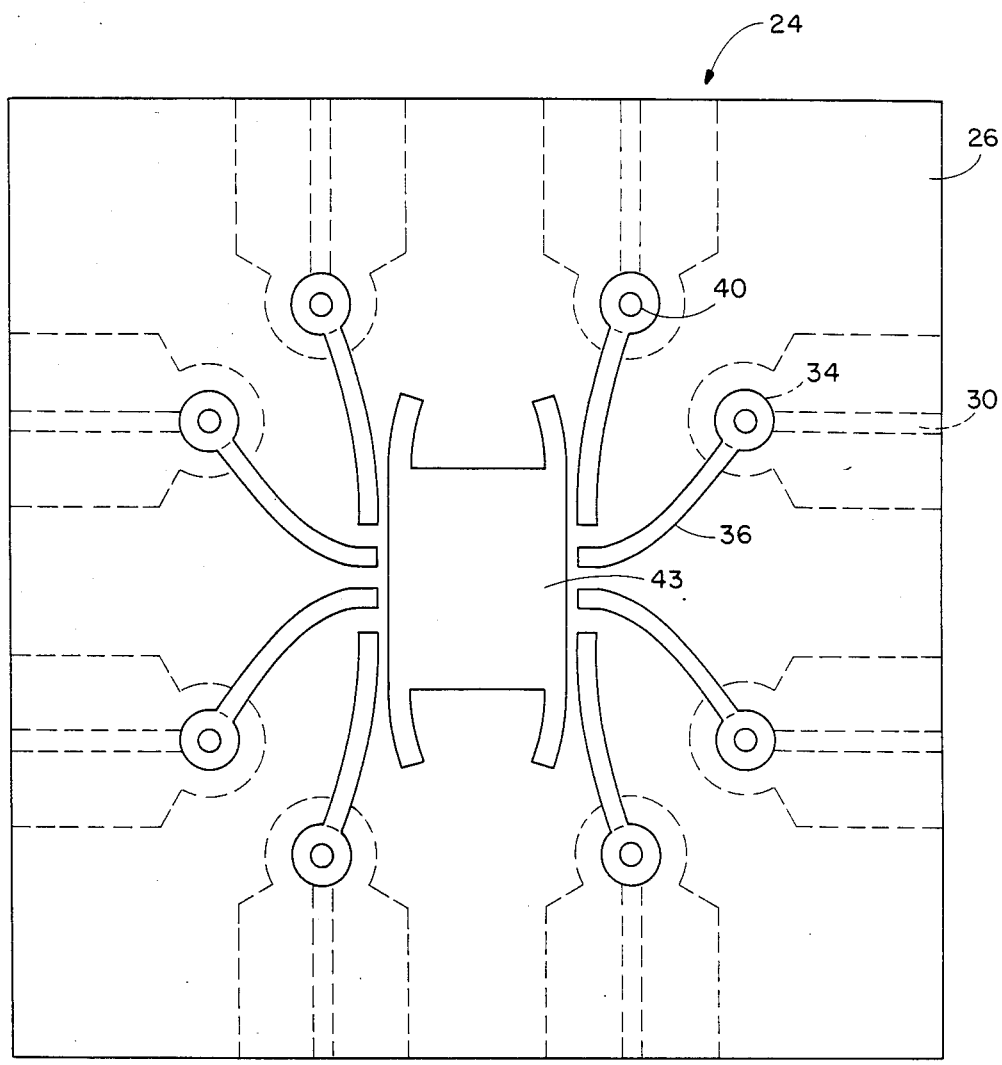
FIG. 3 is a plan view for the hybrid circuit of the surface mountable microwave package.
Figure 4:
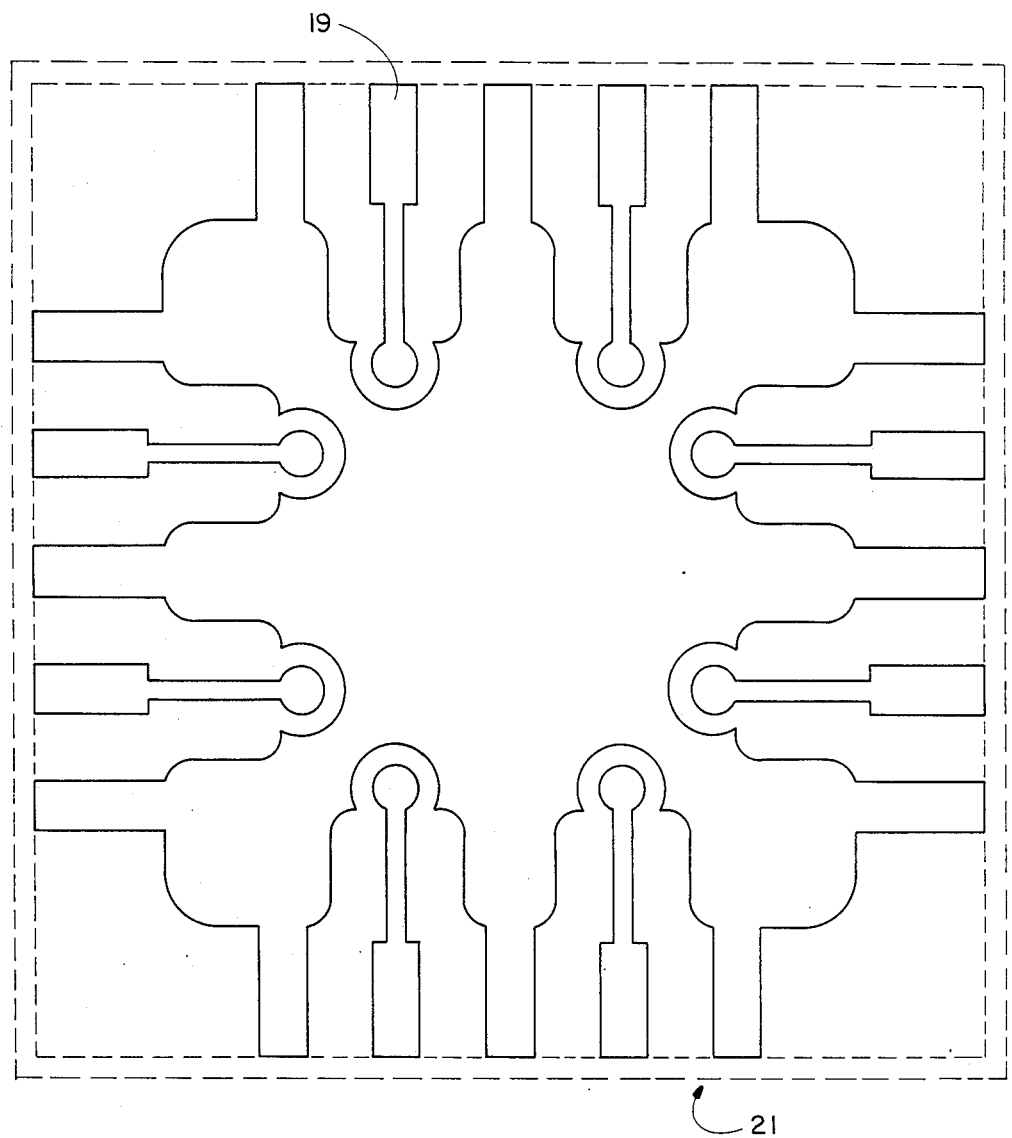
FIG. 4 is a plan view of a lead frame for the hybrid circuit of FIG. 3.

Referring now to FIGS. 1, 3 and 4 a printed circuit board 10 is shown having a substrate 12 and a ground plane 14 on the bottom of the substrate. A microstrip transmission line 16 is located on the top surface of the substrate 12. Ground pads 18 are located on the top surface of the substrate 12 near the end 20 of the transmission line 16, each pad having a metallized through-hole 22 to connect the pad with the ground plane 14 on the opposite side of the substrate. A controlled impedance taper of the transmission line end 20 brings the transmission line width down to a geometry commensurate with the surface mount package pinout 19.

A surface mountable package 24 has a carrier substrate 26, typically of a ceramic material well-known in the art, with a metallization layer, or ground plane, 28 on the bottom. A portion of the ground plane 28 is removed to form a co-planar transmission line 30. The co-planar transmission line 30 has a lead end 32 and a termination end 34. The co-planar transmission line 30 may be composed of an etched lead frame brazed to the substrate metallization. A microstrip transmission line 36 has a termination end 38 and is located on the top surface of the substrate 26. A metallized through-hole 40 connects the termination ends 34, 38 of the respective transmission lines 30, 36. An IC 42 is mounted on a mounting pad 43 on the carrier substrate and is electrically connected to the microstrip transmission line 36. The pinout 19 is formed by a lead frame 21 which extends beyond the edge of the surface mount package 24. A lid 25 may be solder sealed to the package 24 for both a hermetic seal and shielding.

Figure 2:
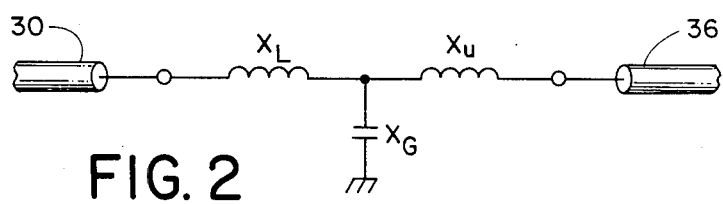
FIG. 2 is a schematic view of an equivalent circuit for the package of FIG. 1.

The equivalent circuit for the circuit on the surface mountable package 24 is represented in FIG. 2. The co-planar transmission line 30 is represented as a coaxial cable, as is the microstrip line 36. The inductance $X_L$ represents the portion L of the coplanar transmission line 30 which crosses the gap G between the ground plane 28 and the through-hole 40 metallization, connecting with the termination end 34. Likewise, the inductance $X_U$ represents the portion U of the microstrip transmission line 36 which also crosses the gap G, connecting with the termination end 38. The capacitance $X_G$ represents the gap G, and can be altered by adjusting the width of the gap to compensate for inductances introduced by the transmission lines 30, 36 and the through-hole 40. For standard 50 ohm transmission lines the co-planar line 30 is 10 mils wide with a three mil gap on each side. The substrate 26 is typically 10 mils thick of alumina ($AlO_3$) or the like. For a hole 40 of 10 mils diameter a 15 mil annulus forms the gap G, determined empirically. For thick substrates 26 of 25 mils or greater the microstrip transmission line 26 may be replaced with a co-planar transmission line to keep the line width small.

Figure 5:
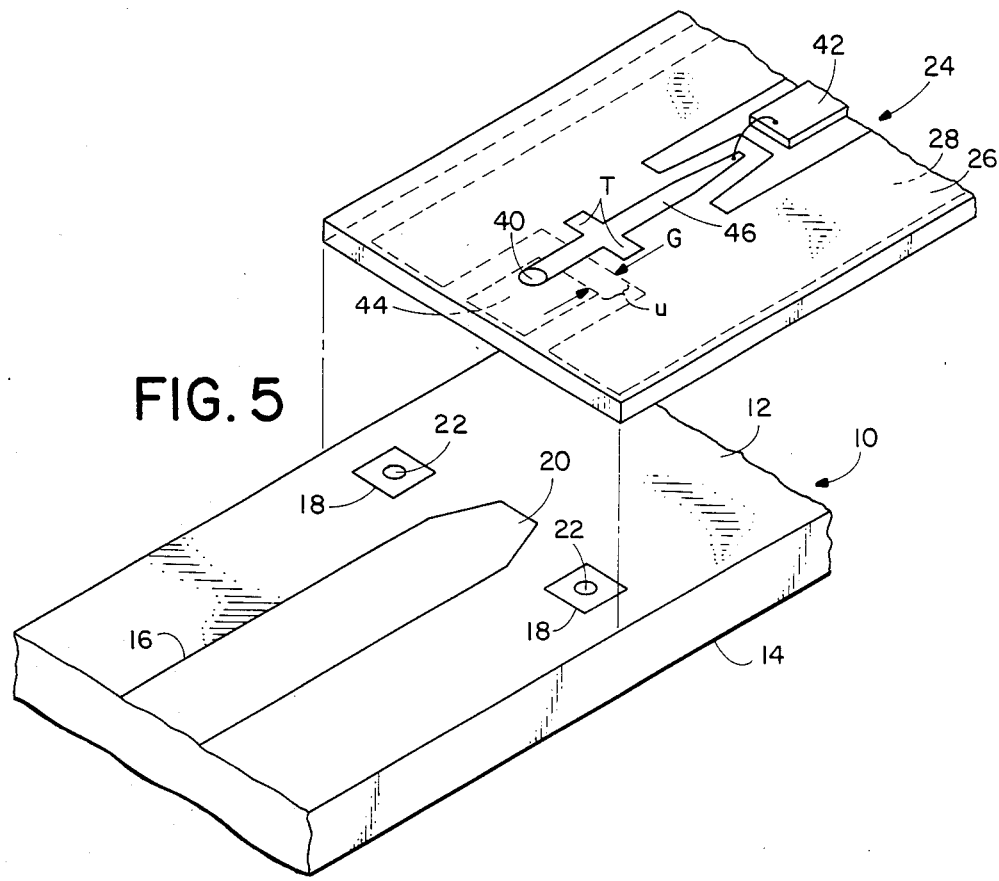
FIG. 5 is an exploded perspective view of an alternative embodiment of an IC surface mountable microwave package according to the present invention.
Figure 6:
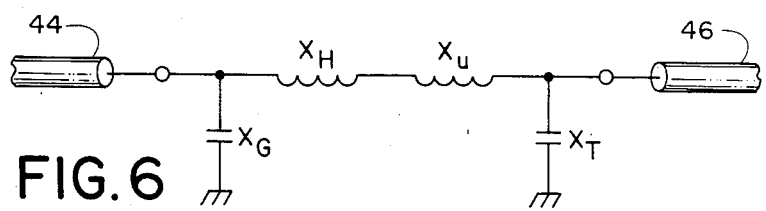
FIG. 6 is a schematic view of an equivalent circuit for the package of FIG. 5.

Another embodiment is shown in FIG. 5. A co-planar transmission line section 44 is in the form of a pad, and a microstrip transmission line 46 is in the form of a "t" terminated in a coplanar line connected to IC42. Referring to the equivalent circuit of FIG. 6 $X_G$ represents the capacitance of the gap G, $X_H$ represents the inductance of the through-hole 40, $X_U$ represents the portion U of the transmission line 46 across the gap G, and $X_T$ represents the capacitance introduced by the width step T. The capacitive reactances $X_G$ and $X_T$ provide shunt capacitance to compensate for the inductance of the through-hole 40.

For both embodiments the surface mountable package 24 is placed on the printed circuit board 10 so that the ground plane 28 contacts the ground pads 18 and the co-planar transmission lines 30, 44 contact the end 20 of the micro-strip transmission line 16 on the printed circuit board. The package 24 is then connected to the board 10 using conventional techniques such as reflow soldering. Preferably the co-planar transmission line 30, 44 and hole 40 are bonded to a lead frame 21 of a material such as Kovar which provides a hermetic seal and ease of inspection of the reflow solder connections. The etched leads 19 give a measure of compliance which compensates for the difference in temperature coefficients of expansion between the ceramic substrate 24 and the material of the PCB substrate 12, typically Teflon or glass fiber.

Figure 7:
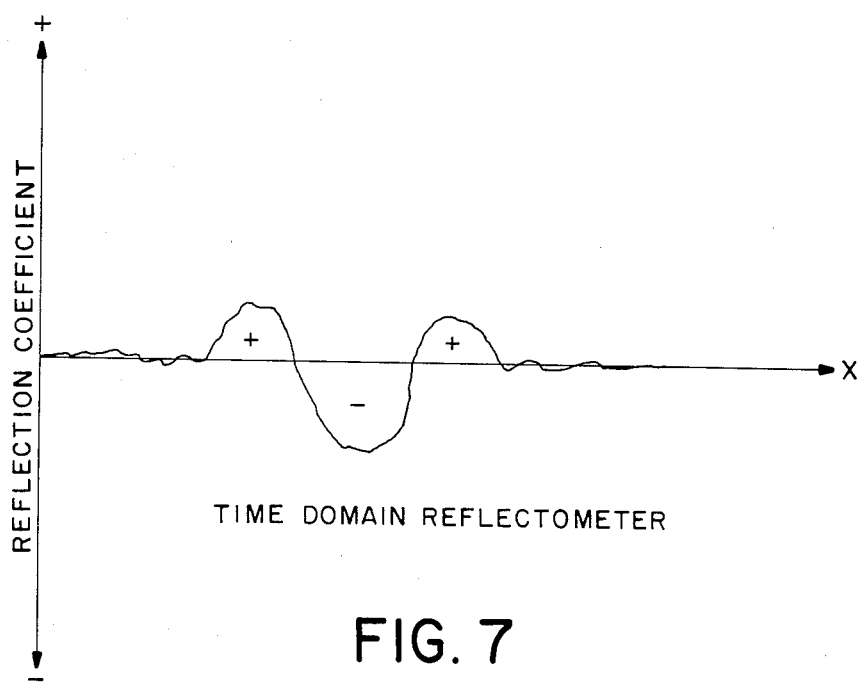
FIG. 7 is a graphic view of a time domain reflectometer output for the package of FIG. 1.

The values for the various inductances and compensating capacitances caused by the gap G are solved empirically simultaneously as described below such that $50 = X_L + X_U = X_G$ or $50 = X_H + X_U = X_G$ for the two embodiments, respectively. As shown in FIG. 7 for the first embodiment the portion of the graph which is positive represents inductance and the portion which is negative represents capacitance. For compensation the negative area should equal the positive area.

Thus, the present invention provides a hermetic, surface mountable microwave IC package which is operable at frequencies up to 20 gigahertz and is relatively inexpensive.

What is claimed is:

1. A surface mountable microwave package comprising:
   a printed circuit board having a first microwave transmission line thereon with ground pads adjacent the end of said microwave transmission line;
   a carrier substrate;
   a co-planar transmission line on the bottom of said substrate situated so as to make electrical contact with said first microwave transmission line on said printed circuit board;
   a second microwave transmission line on the top of said carrier substrate connected to said co-planar transmission line via a metallized through-hole, an integrated circuit being connected to said second microwave transmission line;
   said package, during operation, having said carrier substrate placed on and connected to said printed circuit board.

2. A package as recited in claim 1 wherein said second microwave transmission line comprises a microstrip transmission line.

3. A package as recited in claim 1 wherein said second microwave transmission line comprises a co-planar transmission line.

4. A package as recited in claim 1 further comprising:
   a lead frame brazed to said co-planar waveguide transmission line for sealing the electrical connection via said metallized through-hole and for connecting with said first microwave transmission line; and
   a solder sealed hermetic lid enclosing said carrier substrate.

5. A package as recited in claim 1 wherein said co-planar transmission line further comprises capacitive means for compensating for inductive reactances introduced by said co-planar and said second microwave transmission lines at the metallized through-hole.

6. A package as recited in claim 5 wherein said capacitive means comprises a gap surrounding the end of said co-planar transmission line and said through-hole, the width of said gap being adjusted to provide a required compensation.

7. A package as recited in claim 6 wherein said capacitive means further comprises a width step integral with and near the end of said second microwave transmission line.

8. A surface mountable microwave IC package for mounting on a printed circuit board having a first microwave transmission line, said IC package comprising:
   a carrier substrate;
   a co-planar waveguide transmission line on the bottom of said carrier substrate configured for connection to said first microwave transmission line; and
   a second microwave transmission line on the top of said carrier substrate, electrically connected to said co-planar waveguide transmission line via a metallized through-hole, to which an integrated circuit is electrically connected; and
   said package, during operation, having said carrier substrate placed on and connected to said printed circuit board.

9. A package as recited in claim 8 further comprising:
   a lead frame brazed to said co-planar waveguide transmission line for sealing the electrical connection via said metallized through-hole and for connecting with said first microwave transmission line; and
   a solder sealed hermetic lid enclosing said carrier substrate.

* * * * *